US009647197B2

(12) United States Patent
Kikuta et al.

(10) Patent No.: US 9,647,197 B2
(45) Date of Patent: May 9, 2017

(54) PIEZOELECTRIC CERAMICS AND METHOD FOR MANUFACTURING THE SAME

(71) Applicants: Koichi Kikuta, Nagoya (JP); Jun Isono, Nagoya (JP); Keiji Kura, Nagoya (JP); Yoshitsugu Morita, Nagoya (JP)

(72) Inventors: Koichi Kikuta, Nagoya (JP); Jun Isono, Nagoya (JP); Keiji Kura, Nagoya (JP); Yoshitsugu Morita, Nagoya (JP)

(73) Assignee: NATIONAL UNIVERSITY CORPORATION NAGOYA UNIVERSITY, Aichi-ken (JP)

( * ) Notice: Subject to any disclaimer, the term of this patent is extended or adjusted under 35 U.S.C. 154(b) by 879 days.

(21) Appl. No.: 13/926,347

(22) Filed: Jun. 25, 2013

(65) Prior Publication Data

US 2014/0027666 A1 Jan. 30, 2014

(30) Foreign Application Priority Data

Jul. 26, 2012 (JP) ................................. 2012-165530

(51) Int. Cl.
*H01L 41/187* (2006.01)
*H01L 41/43* (2013.01)
(Continued)

(52) U.S. Cl.
CPC ........ *H01L 41/1873* (2013.01); *C01G 33/006* (2013.01); *C01G 35/006* (2013.01);
(Continued)

(58) Field of Classification Search
CPC ... H01L 41/1873; H01L 41/43; H01L 41/187; C04B 2235/3201; C04B 2235/3251;
(Continued)

(56) References Cited

U.S. PATENT DOCUMENTS

2004/0127344 A1* 7/2004 Sato ...................... C04B 35/495
501/134
2009/0121589 A1 5/2009 Kaigawa et al.
(Continued)

FOREIGN PATENT DOCUMENTS

| CN | 101376594 A | * | 3/2009 |
| JP | 2011-88786 | | 5/2011 |
| JP | 2011088786 A | * | 5/2011 |

OTHER PUBLICATIONS

Machine translation of JP2011088786A, printed Mar. 31, 2016, 8 pages.*
(Continued)

*Primary Examiner* — Matthew E Hoban
*Assistant Examiner* — Lynne Edmondson
(74) *Attorney, Agent, or Firm* — Haug Partners LLP

(57) ABSTRACT

There is provided a piezoelectric ceramics, including a perovskite compound of a non-stoichiometric composition represented by a composition formula $(K_xNa_{1-x})_y(Nb_{1-z}Ta_z)O_3$ ($0<x\leq1$, $0<y<1$, $0\leq z\leq0.5$); and a sintering aid which includes an oxide containing K, Co, and Ta.

10 Claims, 1 Drawing Sheet

(51) Int. Cl.
  *C01G 51/00* (2006.01)
  *C04B 35/495* (2006.01)
  *C04B 35/626* (2006.01)
  *C01G 33/00* (2006.01)
  *C01G 35/00* (2006.01)
  *C01G 49/00* (2006.01)

(52) U.S. Cl.
  CPC ......... *C01G 49/0027* (2013.01); *C01G 51/42* (2013.01); *C04B 35/495* (2013.01); *C04B 35/62675* (2013.01); *C04B 35/62685* (2013.01); *H01L 41/43* (2013.01); *C01P 2006/10* (2013.01); *C04B 2235/3201* (2013.01); *C04B 2235/3251* (2013.01); *C04B 2235/3255* (2013.01); *C04B 2235/3275* (2013.01); *C04B 2235/442* (2013.01); *C04B 2235/604* (2013.01); *C04B 2235/768* (2013.01); *C04B 2235/77* (2013.01); *C04B 2235/79* (2013.01)

(58) Field of Classification Search
  CPC ...... C04B 2235/768; C04B 2235/3255; C04B 2235/3275; C04B 2235/79; C04B 2235/80; C04B 2235/85; C04B 35/495; C04B 35/6303; C01G 33/006; C01G 35/006; C01G 51/42; C01P 2002/34
  USPC ...... 252/62.9 R, 62.9 PZ; 501/134; 264/614; 310/358
  See application file for complete search history.

(56) References Cited

U.S. PATENT DOCUMENTS

2009/0212254 A1\* 8/2009 Kaigawa ............... C04B 35/495
  252/62.9 R
2012/0030916 A1\* 2/2012 Takahashi ............ H01L 41/338
  29/25.35

OTHER PUBLICATIONS

Machine translation of CN101376594A, printed Mar. 30, 2016, 13 pages.\*
Extended European Search Report for EP Application No. 13177276.6 dated Oct. 9, 2015.
M. Matsubara et al., "Piezoelectric properties of $(K_{0.5}Na_{0.5})(Nb_{1-x}Ta_x)O_3$-$K_{5.4}CuTa_{10}O_{29}$ Ceramics", Journal of Applied Physics 97, 114105, May 27, 2005.
Notice of Reasons for Rejection for JP Application No. 2012-165530 dated Mar. 15, 2016.

\* cited by examiner

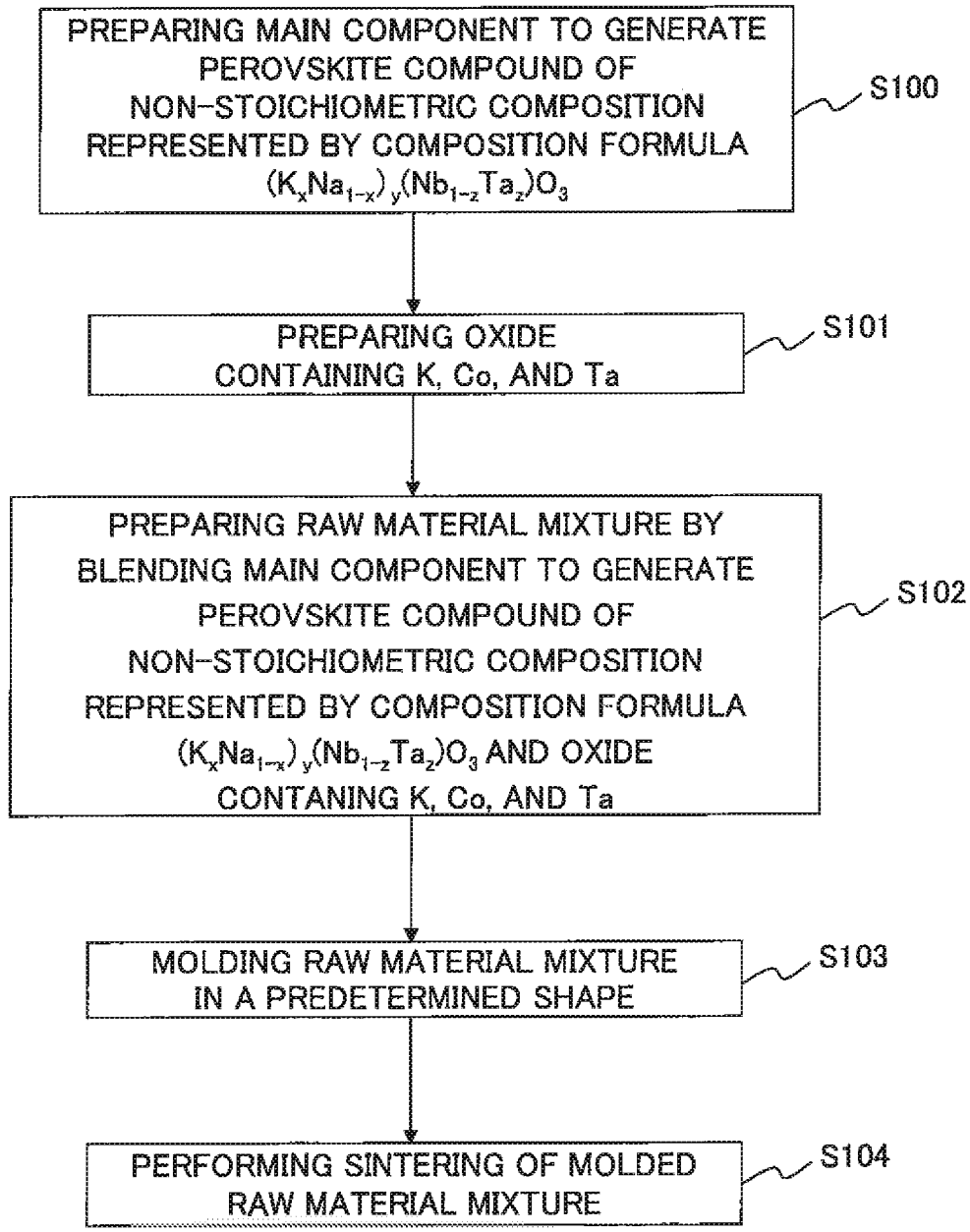

PIEZOELECTRIC CERAMICS AND METHOD FOR MANUFACTURING THE SAME

CROSS REFERENCE TO RELATED APPLICATION

The present application claims priority from Japanese Patent Application No. 2012-165530 filed on Jul. 26, 2012 the disclosure of which is incorporated herein by reference in its entirety.

BACKGROUND OF THE INVENTION

Field of the Invention

The present invention relates to a piezoelectric ceramics and a method for manufacturing the same.

Description of the Related Art

A piezoelectric body is applied, as a material which is capable of converting electrical energy into mechanical energy, in various fields such as a filter and an actuator. A currently mainstream piezoelectric material is a lead-based perovskite compound containing a main component of lead titanate zirconate ($Pb(Zr,Ti)O_3$). This compound contains the lead (in particular, PbO), and thus it is suspected damage to natural environment and the like. In view of this, an investigation is started to use a non-lead-based piezoelectric ceramics as an alternative material to the lead-based piezoelectric material from a standpoint of the natural environmental consideration.

As the non-lead-based piezoelectric ceramics, a material composed mainly of potassium sodium niobate ($(K,Na)NbO_3$) is known as a material in which piezoelectric characteristics such as electromechanical coupling coefficient and mechanical quality factor are superior.

In a case that the piezoelectric ceramics as described above is produced, the piezoelectric ceramics is required to be sintered for a long period of time (in general, for 2 to 5 hours, for example). However, there is such a problem that difference in composition is occurred because highly-volatile K, Na components evaporate easily. In view of this, in order to complete sintering for a short period of time and to improve productivity, a sintering aid or a sintering additive is added to the piezoelectric ceramics.

For example, Japanese Patent Application laid-open No. 2011-88786 discloses a piezoelectric ceramics in which, as the sintering aid, an oxide containing Cu and Ta or containing Cu and Nb, and a simple perovskite compound represented by the composition formula $MTiO_3$ (in the composition formula, M is Ca or Sr) are blended with respect to a perovskite compound of a non-stoichiometric composition represented by the composition formula $(K_xNa_{1-x})_y(Nb_{1-z}Ta_z)O_3$ (in the composition formula, $0<x\leq1$, $0<y<1$, $0\leq z\leq0.5$). This piezoelectric ceramics has superior piezoelectric characteristics and high productivity.

SUMMARY OF THE INVENTION

The sintering aid is a component which is capable of performing the sintering in a short time. The piezoelectric ceramics using the sintering aid, however, tends to be harder than a piezoelectric ceramics for which no sintering aid is used. The piezoelectric ceramics described in Japanese Patent Application laid-open No. 2011-88786 has a mechanical quality factor Qm of a high value (for example, $Qm\geq341$), and thus this piezoelectric ceramics is relatively harder. However, there are some fields in which a piezoelectric ceramics which is soft and has a small mechanical quality factor Qm is required. For example, in a case that the piezoelectric ceramics is applied to a piezoelectric actuator of an ink-jet printer, the piezoelectric ceramics representing the small mechanical quality factor Qm is preferably used, because it is possible to realize a piezoelectric actuator having a larger displacement characteristic and there is the advantage that processing is readily performed. In a case that the piezoelectric ceramics is applied to the piezoelectric actuator of the ink-jet printer, it is preferable that the mechanical quality factor Qm of the piezoelectric ceramics is substantially 100. In view of the above, an object of the present teaching is to provide a non-lead-based piezoelectric ceramics which can be sintered in a short time and represents a small mechanical quality factor.

In order to solve the above problem, the inventors carried out various investigations regarding composition of the piezoelectric ceramics and have found out that the piezoelectric ceramics representing a small mechanical quality factor is obtained by blending a sintering aid composed of an oxide containing a particular element with a perovskite compound of a non-stoichiometric composition represented by the composition formula $(K_xNa_{1-x})_y(Nb_{1-z}Ta_z)O_3$.

According to a first aspect of the present teaching, there is provided a piezoelectric ceramics, including a perovskite compound of a non-stoichiometric composition represented by a composition formula $(K_xNa_{1-x})_y(Nb_{1-z}Ta_z)O_3$ ($0<x\leq1$, $0<y<1$, $0\leq z\leq0.5$); and a sintering aid which includes an oxide containing K, Co, and Ta.

According to a second aspect of the present teaching, there is provided a method for manufacturing a piezoelectric ceramics, including:

preparing a main component to form a perovskite compound of a non-stoichiometric composition represented by a composition formula $(K_xNa_{1-x})_y(Nb_{1-z}Ta_z)O_3$;

preparing a sintering aid which includes an oxide containing K, Co, and Ta;

preparing a raw material mixture by blending the main component to form the perovskite compound of the non-stoichiometric composition and the sintering aid;

molding the raw material mixture in a predetermined shape; and performing sintering of the molded raw material mixture, The piezoelectric ceramics according to the present teaching can be sintered in a short time, represents a small mechanical quality factor, and is soft. Further, since the piezoelectric ceramics of the present teaching is soft, there is an advantage such that processing is performed easily.

BRIEF DESCRIPTION OF THE DRAWINGS

FIG. 1 shows a flowchart showing a method for manufacturing a piezoelectric ceramics according to the present teaching.

DESCRIPTION OF THE PREFERRED EMBODIMENTS

Hereinbelow, an embodiment of the present teaching will be explained in detail.

<Composition>

The piezoelectric ceramics according to the present teaching is non-lead-based piezoelectric ceramics of which main component is a perovskite compound of a non-stoichiometric composition represented by the composition formula $(K_xNa_{1-x})_y(Nb_{1-z}Ta_z)O_3$. The piezoelectric ceramics includes an oxide containing at least K, Co, and Ta, as a sintering aid (also referred to as a sintering aid), with respect to the main component.

The perovskite compound of the non-stoichiometric composition represented by the composition formula $(K_xNa_{1-x})_y(Nb_{1-z}Ta_z)O_3$ composes or constitutes the main component of the piezoelectric ceramics of the present teaching.

The "x" in the above composition formula represents a positive number of not more than 1. The "x" is preferably about 0.4 to 0.6, and most preferably 0.5. That is, the perovskite compound of the non-stoichiometric composition represented by $(K_{0.5}Na_{0.5})_y(Nb_{1-z}B_z)O_3$ is used most preferably. In the perovskite compound, in a case that ratio of K to the sum of K and Na is increased, sintering performance is more likely to be decreased; and in a case that ratio of Na to the sum of K and Na is increased, piezoelectric characteristics are more likely to be decreased. Thus, an appropriate value of the "x" may be determined in consideration of the tendencies as described above. According to the investigation of the inventors, in a case that the value of the "x" is set to about 0.5, it is possible to realize both the appropriate sintering performance and the appropriate piezoelectric characteristics.

In the perovskite compound of the non-stoichiometric composition, the element $(Nb_{1-z}Ta_z)$ configuring B site of the perovskite compound is excessive as compared with the element $(K_xNa_{1-x})$ configuring A site of the perovskite compound. In the composition formula, the "y" representing ratios of the A site and the B site represents a positive number of less than 1, and preferably is not less than 0.9. In so doing, an excessive amount of the element (Nb,Ta) configuring the B site, that is, deviation from stoichiometric proportion is stayed appropriately. Thus, it is possible to show superior piezoelectric characteristics as compared with a case in which the "y" is less than 0.9. More preferably, the "y" is not less than 0.9 and less than 0.999. In other words, B site ion is set to be excessive relative to A site ion by not less than 0.1 mol %, and thereby making it possible to realize the superior piezoelectric characteristics as compared with a case other than the above.

The "z" in the composition formula represents a number which is not less than 0 and not more than 0.5. More preferably, the "z" is not more than 0.4. In so doing, it is suppressed that the piezoelectric characteristics such as an electromechanical coupling coefficient and the like are decreased due to excess of Ta, and thus it is possible to obtain the piezoelectric ceramics having far superior characteristics. En general, in a case that Nb is substituted by Ta, dielectric constant is more likely to be improved, but the sintering performance is more likely to be decreased to reduce density. Further, in a case that the "z" is not less than a certain amount, the piezoelectric characteristics are also decreased. Therefore, in order to increase the dielectric constant, it is desired that the value of the "z" is as large as possible, and at the same time, it is desired that the value of the "z" is remained small within a range in which the sintering in a short time can be performed. Further, in the present teaching, the value of the "z" is most preferably around 0.33 (for example, not less than 0.30 and not more than 0.35). In the present teaching, by adding the oxide containing K, Co, and Ta as the sintering aid, even when the "z" is such a small numerical value, it is possible to realize excellent piezoelectric characteristics. By adjusting the value of "z", it is possible to adjust the piezoelectric characteristics such as an electromechanical coupling coefficient kp, a mechanical quality factor Qm, a relative dielectric constant c, a dielectric loss tan δ, and a piezoelectric constant.

The oxide containing the components (K, Co, and Ta) which are contained, as the sintering aid, in the piezoelectric ceramics of the present teaching suppresses melting of the perovskite compound of the non-stoichiometric composition and improves the sintering performance under the condition that abnormal grain growth is restrained. Compared with the oxide containing Cu described in Japanese Patent Application laid-open No. 2011-88786, the oxide of the present teaching contains Co which is solid-soluted differently from Cu of Japanese Patent Application laid-open No. 2011-88786, and thus oxygen defect is reduced in a case that the oxide of the present teaching is blended with the perovskite compound of the non-stoichiometric composition. Therefore, compared with a case in which the oxide containing Cu is used, it may be possible to provide a softer piezoelectric ceramics.

The oxide containing K, Co, and Ta is preferably an oxide represented by the composition formula $K_aCo_bTa_cO_d$. In the composition formula, the "a", "b", "c", and "d" represent arbitrary positive numbers, respectively. By adding the oxide as the sintering aid, it is possible to provide the piezoelectric ceramics which is soft and has the small mechanical quality factor Qm as compared with the case in which the oxide containing Cu is added. The oxide may be a single compound or may be a mixture containing various oxides. In a case that the oxide is the mixture, the mixture may be any mixture provided that the composition of the entire mixture contains K, Co, Ta, and O.

The present teaching is characterized in that the oxide, which contains K, Co, and Ta, is used as the sintering aid. An appropriate composition ratio of each element contained in the composition can be determined by experiments conducted by those skilled in the art in view of manufacturability (possibility of the sintering) of the piezoelectric ceramics, the mechanical quality factor Qm represented by the piezoelectric ceramics, and/or the piezoelectric constant represented by the piezoelectric ceramics. Therefore, although the composition ratios of K, Co, and Ta in the oxide are not especially limited, preferable ratio ranges will be explained below.

In the oxide, molar ratio of K to the total number of moles of K, Co, and Ta is preferably not more than about four-thirteenths. In a case that the ratio of K in the oxide is higher than the ratio as described above, a liquid phase is more likely to be generated or formed during the sintering. Thus, there is fear that a formed or molded body is melted and/or the shape of the formed body is collapsed during the sintering. Therefore, there is fear that it is not possible to produce the piezoelectric ceramics as a sintered body.

In the oxide, molar ratio of Co to the total number of moles of K, Co, and Ta is preferably not more than about one-half, more preferably not more than about three-tenths. In a case that the ratio of Co in the oxide is too high (or in a case that the ratio of K and/or Ta is too low), the mechanical quality factor Qm becomes larger. As a result, there is fear that it is not possible to obtain the soft piezoelectric ceramics and that the piezoelectric constant of the piezoelectric ceramics becomes small.

In the oxide, molar ratio of Ta to the total number of moles of K, Co, and Ta is preferably not less than about three-tenths, more preferably not less than about one-half. In a case that the ratio of Ta in the oxide is too low, there is fear that it is not possible to produce the piezoelectric ceramics as the sintered body due to the melting of the formed body and/or the collapse of the shape of the formed body during the sintering. By increasing the ratio of Ta, it is possible to obtain the piezoelectric ceramics which is soft and has the large piezoelectric constant.

The blending ratio of the oxide in the piezoelectric ceramics of the present teaching is not especially limited. As mentioned in Examples which will be described later, the blending ratio of the oxide can be determined by experiments conducted by those skilled in the art in view of the manufacturability (possibility of the sintering), the mechanical quality factor Qm, the piezoelectric constant, and the like of the piezoelectric ceramics. Also, a preferable blending ratio of the oxide may be changed depending on composition ratio of each element in the oxide, and thus can not be defined unconditionally. Further, the preferable blending ratio of the oxide may be changed depending on presence or absence of combination use of sintering-auxiliaries and the blending ratio between the sintering-auxiliaries. As one example, the blending ratio of the oxide is preferably an amount of such an extent that the ratio of Co exceeds about 0.1 mol % and is less than 2.0 mol % provided that the sum of the number of moles of the perovskite compound of the non-stoichiometric composition and the number of moles of the oxide (the number of moles based on Co atom) is 100 mol %. The blending ratio of the oxide is more preferably not less than about 0.3 mol % and not more than 1.0 mol %. In a case that the blending ratio of the oxide is too low, the oxide can not function as the sintering aid, and there is fear that it is not possible to perform the sintering in a short time. In a case that the blending ratio of the oxide is too high, there is fear that the piezoelectric characteristics exhibited by the perovskite compound of the non-stoichiometric composition as the main component are inhibited. From the standpoints as described above, it is possible to determine the appropriate blending ratio by conducting the experiments.

In the piezoelectric ceramics of the present teaching, a compound other than the oxide containing K, Co, and Ta may be appropriately blended as an additive. The compound is exemplified, for example, by a simple perovskite compound represented by the composition formula $MTiO_3$, manganese oxide ($Mn_3O_4$), zinc oxide (ZnO), and $LaMnO_3$. By blending the additive(s), it is possible to further increase the piezoelectric constant of the piezoelectric ceramics.

The piezoelectric ceramics of the present teaching does not contain Pb, and thus is superior in terms of burdens on the environment. Further, the piezoelectric ceramics of the present teaching can realize a large piezoelectric constant without containing an element selected from the group consisting of In, Sc, Y, Nd, Sm, Eu, Gd, Tb, Dy, Ho, Er, Yb, and Lu.

<Manufacturing Method>

Next, an explanation will be made about a method for manufacturing piezoelectric ceramics according to the present teaching with reference to FIG. 1.

The method for producing the piezoelectric ceramics according to the present teaching includes: preparing a main component to generate or form a perovskite compound of a non-stoichiometric composition represented by a composition formula $(K_xNa_{1-x})_y(Nb_{1-z}Ta_z)O_3$ (S100); preparing an oxide containing K, Co, and Ta (S101); preparing a raw material mixture by blending the main component to generate or form the perovskite compound of the non-stoichiometric composition represented by the composition formula $(K_xNa_{1-x})_y(Nb_{1-z}Ta_z)O_3$ and the oxide containing K, Co, and Ta (S102); molding the raw material mixture in a predetermined shape (S103); and performing sintering of the molded raw material mixture (S104). The sintering of the molded raw material mixture can be performed, for example, at normal pressures or atmospheric pressure. The raw material mixture can contain another sintering aid or any component forming or generating the raw material mixture, if necessary.

The oxide containing K, Co, and Ta can be produced as follows. That is, raw materials such as $KHCO_3$ (or $K_2CO_3$), $NaHCO_3$, CoO, and $Ta_2O_5$ are prepared and the raw materials are wet-blended at a predetermined ratio. Then, the obtained mixture is pre-calcined in atmosphere. The wet-blending can be performed such that ethanol etc., is used as a dispersion medium and the mixture is performed by a ball mill for about 48 hours. As a condition for the pre-calcination, a temperature of about 800° C. is necessary to be continued for 2 hours, however, the condition for the pre-calcination is not especially limited. By performing the pre-calcination, a hydrogen carbonate ion in the raw material is decomposed and reaction of the hydrogen carbonate ion with another component is progressed and thereby making it possible to form an oxide as an objective.

In a case that it is prepared the raw material mixture containing: the main component to generate or form the perovskite compound of the non-stoichiometric composition represented by the composition formula $(K_xNa_{1-x})_y(Nb_{1-z}Ta_z)O_3$; the oxide containing K, Co, and Ta; another sintering aid and the like if necessary, each of the raw materials is wet-blended at the predetermined ratio, and then drying and classification treatment can be performed at a temperature about 100° C. The wet-blending can be performed such that the ethanol etc., is used as the dispersion medium and the mixture is performed by the ball mill for about 48 hours.

Although various forming or molding methods of a general ceramics can be used in forming or molding of the raw material mixture, a Cold Isostatic Pressing (CIP) is especially preferably used. When using the CIP, the pressure is preferably set to, for example, about 180 MPa.

Thereafter, the obtained formed or molded body is sintered at normal pressures to obtain the piezoelectric ceramics. The sintering may be performed in air or an oxygen stream, at a temperature from about 1050° C. to about 1200° C., for an hour.

<Uses Etc.>

The piezoelectric ceramics of the present teaching is capable of changing the form or shape depending on various uses. The size and shape of the piezoelectric ceramics is not especially limited. The shape is exemplified, for example, by a disk or a circular plate, a prism, and a rectangular plate.

The applications or uses of the piezoelectric ceramics of the present teaching are not especially limited. The piezoelectric ceramics of the present teaching, however, is preferably used, for example, in an ultrasonic actuator, a sensor, a filter, an oscillator, and a ultrasonic motor.

EXAMPLES

The present teaching will be explained below more specifically as exemplified by Examples. The present teaching, however, is not limited to the Examples.

Examples 1 to 4 and Comparative Examples 1 to 6

In each of Examples 1 to 4 and Comparative Examples 1 to 6, $KHCO_3$, $NaHCO_3$, CoO, and $Ta_2O_5$ were used as raw materials, pre-calcination was performed in accordance with the procedure as described above, and thereby obtaining the oxide having the composition formula shown in Table 1. The oxide was not the single compound but the mixture, such as $KTaO_3$, $K_2Ta_4O_{11}$, $Ta_2O_5$, and $CoTa_2O_9$, which had the composition formula shown in Table 1 as the entire mixture. That is, this composition was an average composition in the entire mixture. Subsequently, the oxide was wet-blended with $(K_{0.5}Na_{0.5})(Nb_{0.7}Ta_{0.3})O_3$ (hereinbelow, also referred to as KNNT in an abbreviated manner), follow by performing drying and classification treatment. After performing the forming or molding by CIP, the sintering was performed in air for 1 hour at a temperature from about 1050° C. to about 1200° C. to obtain the piezoelectric ceramics. The ratio of KNNT and the oxide was set to be 99.5KNNT:0.5 (1/h ($K_gCo_hTa_jO_j$)). In other words, the ratio of KNNT and the oxide was set so that Co amount was 0.5 mol % provided that the total number of moles of KNNT and Co in the oxide was 100 mol %. However, regarding Comparative example 6 in which the oxide which did not contain Co was used, the ratio of KNNT and the oxide was set to be 99.5KNNT: $0.5K_2Ta_8O_{21}$.

After processing the obtained ceramics to have the disk or the circular plate shape having a thickness of 1 mm, a polarization treatment was performed at applied voltage of 2 kV/mm in a condition that a temperature was maintained at 100° C. Thereafter, it was left at a room temperature for 24 hours to perform aging, followed by performing evaluation of an electric characteristic. The evaluation was performed by a resonance-anti-resonance method employing an impedance analyzer in accordance with "piezoelectric ceramics oscillator electrical test method (EMAS-6100)", standard of Electronic Materials Manufacturers Association of Japan (dielectric constant $\in_r$, dielectric loss tan δ mechanical quality factor Qm, electromechanical coupling coefficient kp, frequency constant Fc). Further, the piezoelectric constant $d_{33}$ was evaluated by a piezoelectric parameter measuring device.

Results of the evaluation are shown Table 1.

1 to 4, the liquid phase made of the sintering aid was formed during the sintering to improve the sintering performance, and solid-solution states of K, Co, and Ta in the sintering aid to KNNT were different from one another to increase the piezoelectric constant.

On the other hand, in Comparative example 1, since the formed body was melted during the sintering for producing the piezoelectric ceramics, it was not possible to produce the piezoelectric ceramics. In Comparative example 3, since the shape of the formed body was collapsed during the sintering, it was not possible to produce the piezoelectric ceramics. According to the inventors' knowledge and perceptions, the reason of the results is assumed as follows. That is, K content in the oxide was relatively large, and thereby reducing a melting point of the sintering aid. In each of Comparative examples 2 and 4, since the oxide did not contain Ta (or Ta and K), the obtained piezoelectric ceramics had a large mechanical quality factor and a small piezoelectric constant as compared with those in Examples 1 to 4. In each of Comparative examples 5 and 6, since the oxide did not contain K or Co, the sintering of the formed body was not progressed sufficiently during the sintering step under the conditions as described above, and a dense sintered body could not be obtained. This means that the piezoelectric ceramics could not be produced.

Example 5

In a case that 0.5 mol % of oxide and 99.5% of KNNT were wet-blended in Example 3, 0.5 mol % of ZnO, 0.2 mol % of $LaMnO_3$, 1.2 mol % of $Mn_3O_4$ (Mn standard), and 1.5 mol % of $CaTiO_3$ were further added to perform the wet-blending. Other than this respect, the forming or molding and the sintering were performed in the same manner as

TABLE 1

|  | Sintering auxiliary | | Co content (mol %) | Density (g/cm³) | $d_{33}$ (pC/N) | kp | $E_r$ | tan δ (%) | Qm | Fc Hz m |
|---|---|---|---|---|---|---|---|---|---|---|
|  | K:Co:Ta (Composition ratio) | Composition formula | | | | | | | | |
| Example 1 | 4:10:6 | $K_4Co_{10}Ta_6O_{27}$ | 0.5 | 5.16 | 186 | 0.49 | 809 | 2.9 | 104 | 1570 |
| Example 2 | 4:6:10 | $K_4Co_6Ta_{10}O_{33}$ | 0.5 | 5.10 | 203 | 0.48 | 790 | 3.0 | 97 | 1538 |
| Example 3 | 4:1:8 | $K_4CoTa_8O_{23}$ | 0.5 | 5.17 | 181 | 0.42 | 1032 | 3.4 | 83 | 1543 |
| Example 4 | 1:2:7 | $KCo_2Ta_7O_{20}$ | 0.5 | 5.17 | 203 | 0.43 | 1138 | 4.1 | 76 | 1536 |
| Comparative Example 1 | 3:1:1 | $K_3CoTaO_5$ | 0.5 | | | | Melting | | | |
| Comparative Example 2 | 1:1:0 | $KCoO_2$ | 0.5 | 5.06 | 145 | 0.37 | 842 | 7.1 | 143 | 1580 |
| Comparative Example 3 | 2:1:2 | $K_2CoTa_2O_7$ | 0.5 | | | | Partial melting | | | |
| Comparative Example 4 | 0:1:0 | CoO | 0.5 | 5.16 | 165 | 0.44 | 792 | 3.7 | 141 | 1550 |
| Comparative Example 5 | 0:1:2 | $CoTa_2O_4$ | 0.5 | | | | Non-sinterable | | | |
| Comparative Example 6 | 2:0:8 | $K_2Ta_8O_{21}$ | — | | | | Non-sinterable | | | |

As shown in Table 1, the piezoelectric ceramics of each of Examples 1 to 4, in which the oxide containing K, Co, and Ta was blended, as the sintering aid, with KNNT, had a small numerical value of the mechanical quality factor Qm of approximately 100 and a large numerical value of the piezoelectric constant of approximately 200. That is, in each of Examples 1 to 4, it was possible to produce the piezoelectric ceramics which was soft and had the large piezoelectric constant. According to the inventors' knowledge and perceptions, the reason thereof is assumed as follows. That is, regarding the piezoelectric ceramics in each of Examples described above, thereby obtaining the piezoelectric ceramics. The electric characteristic and the piezoelectric constant of the obtained piezoelectric ceramics were evaluated in the same manner as described above. The results thereof are shown in Table 2.

Comparative Example 7

In each of Examples 1 to 4, FeO was used instead of CoO and the pre-calcination was performed, thereby obtaining an oxide represented by $K_4FeTa_8O_{23}$. Then, the oxide and KNNT were wet-blended at a ratio of such an extent that Fe content was 0.5 mol %, provided that the total number of moles of KNNT and Fe in the oxide was 100 mol %. Thereafter, the forming or molding and the sintering were performed in the same manner as described above to obtain the piezoelectric ceramics. The electric characteristic and the piezoelectric constant of the obtained piezoelectric ceramics were evaluated in the same manner as described above. The results thereof are shown in Table 2.

TABLE 2

| | Density (g/cm$^3$) | $d_{33}$ (pC/N) | kP | $E_r$ | tan δ (%) | Qm | Fc Hz m |
|---|---|---|---|---|---|---|---|
| Example 5 | 4.97 | 297 | 0.39 | 1410 | 3.5 | 115 | 1410 |
| Comparative Example 7 | 5.19 | 110 | 0.24 | 1316 | 3.72 | 93 | 1564 |

As shown in Table 2, regarding Example 5 in which another sintering aid was additionally blended to the composition in Example 3, it was possible to produce the piezoelectric ceramics which had a small mechanical quality factor Qm, was soft, and had a large piezoelectric constant. On the other hand, regarding Comparative Example 7 in which the sintering aid containing Fe instead of Co was used, not only the numerical value of the mechanical quality factor Qm but also the piezoelectric constant was small.

Examples 6 to 8 and Comparative Examples 8 to 9

In each of Examples 6 to 9 and Comparative examples 8 to 9, the piezoelectric ceramics was produced by using the same oxide as Example 2. However, the ratio of KNNT and the oxide was set to be different from that of Example 2. Each ratio is shown in Table 3. The Co amount in Table 3 means a Co ratio (mol %), provided that the total number of moles of KNNT and Co in the oxide was 100 mol %. Other than this respect, the piezoelectric ceramics was obtained in the same procedure as Examples 1 to 4 and the electric characteristic and the piezoelectric constant of the obtained piezoelectric ceramics were evaluated in the same manner as described above. The results thereof are shown in Table 3. It is noted that, the results of Example 2 are also shown in Table 3 for reference.

TABLE 3

| | Sintering auxiliary | | Co content (mol %) | Density (g/cm$^3$) | $d_{33}$ (pC/N) | kp | $E_r$ | tan δ (%) | Qm | Fc Hz m |
|---|---|---|---|---|---|---|---|---|---|---|
| | K:Co:Ta (Composition ratio) | Composition formula | | | | | | | | |
| Comparative Example 8 | 4:6:10 | K$_4$Co$_6$Ta$_{10}$O$_{33}$ | 0.1 | | | Non-sinterable | | | | |
| Example 6 | 4:6:10 | K$_4$Co$_6$Ta$_{10}$O$_{33}$ | 0.3 | 5.15 | 201 | 0.49 | 806 | 2.6 | 107 | 1544 |
| Example 2 | 4:6:10 | K$_4$Co$_6$Ta$_{10}$O$_{33}$ | 0.5 | 5.10 | 203 | 0.48 | 790 | 3.0 | 97 | 1538 |
| Example 7 | 4:6:10 | K$_4$Co$_6$Ta$_{10}$O$_{33}$ | 0.7 | 5.14 | 199 | 0.47 | 887 | 2.4 | 86 | 1544 |
| Example 8 | 4:6:10 | K$_4$Co$_6$Ta$_{10}$O$_{33}$ | 1.0 | 5.18 | 206 | 0.45 | 989 | 4.1 | 75 | 1542 |
| Comparative Example 9 | 4:6:10 | K$_4$Co$_6$Ta$_{10}$O$_{33}$ | 2.0 | 5.12 | 164 | 0.35 | 1112 | 3.1 | 67 | 1547 |

Regarding Comparative Example 8 in which the rate of use of the oxide containing K, Co, and Ta was relatively low, the sintering of the formed body was not progressed sufficiently during the sintering step under the conditions as described above, and a dense sintered body could not be obtained. According to the inventors' knowledge and perceptions, the reason thereof is considered as follows. That is, the rate of use of the oxide was too low to perform the sintering in a short time. On the other hand, regarding Comparative Example 9 in which the rate of use of the oxide containing K, Co, and Ta was relatively high, not only the numerical value of the mechanical quality factor Qm but also the piezoelectric constant was small. According to the inventors' knowledge and perceptions, the reason thereof is considered as follows. That is, the oxide blended in the large amount inhibited the piezoelectric characteristics of KNNT. On the other hand, regarding each of Examples 6 to 8 in which the rate of use of the oxide was set to be between Examples 8 and 9, it was possible to produce the piezoelectric ceramics which had the small mechanical quality factor Qm, was soft, and had the large piezoelectric constant, similar to Example 2.

Although the piezoelectric ceramics of the present teaching is a non-lead-based piezoelectric ceramics, the piezoelectric ceramics can be sintered in a short time and has a high productivity. Further, the piezoelectric ceramics of the present teaching has a small piezoelectric constant and a small mechanical quality factor Qm, and thus can be used in a field in which a soft material is required, such as a piezoelectric actuator of an ink-jet printer.

What is claimed is:

1. A piezoelectric ceramic comprising:
a perovskite compound of a non-stoichiometric composition represented by a composition formula $(K_xNa_{1-x})_y(Nb_{1-z}Ta_z)O_3$ ($0<x\leq1$, $0<y<1$, $0<z\leq0.5$); and
a sintering aid which includes an oxide containing K, Co, and Ta.

2. A piezoelectric ceramic comprising:
a perovskite compound of a non-stoichiometric composition represented by a composition formula $(K_xNa_{1-x})_y(Nb_{1-z}Ta_z)O_3$ ($0<x\leq1$, $0<y<1$, $0\leq z\leq0.5$); and
a sintering aid which includes an oxide containing K, Co, and Ta;
wherein, in the sintering aid, a molar ratio of K to a total number of moles of K, Co, and Ta is not more than four-thirteenths.

3. A piezoelectric ceramic comprising:
a perovskite compound of a non-stoichiometric composition represented by a composition formula $(K_xNa_{1-x})_y(Nb_{1-z}Ta_z)O_3$ ($0<x\leq1$, $0<y<1$, $0\leq z\leq0.5$); and
a sintering aid which includes an oxide containing K, Co, and Ta;
wherein, in the sintering aid, a molar ratio of Co to a total number of moles of K, Co, and Ta is not more than one-half.

4. The piezoelectric ceramic according to claim 3;
wherein, in the sintering aid, a molar ratio of Co to a total number of moles of K, Co, and Ta is not more than three-tenths.

5. The piezoelectric ceramic according to claim 1;
wherein, in the sintering aid, a molar ratio of Ta to a total number of moles of K, Co, and Ta is not less than three-tenths.

6. A method for manufacturing a piezoelectric ceramic, comprising:
preparing a main component to form a perovskite compound of a non-stoichiometric composition represented by a composition formula $(K_xNa_{1-x})_y(Nb_{1-z}Ta_z)O_3$ ($0<x\leq1$, $0<y<1$, $0<z\leq0.5$);
preparing a sintering aid which includes an oxide containing K, Co, and Ta;
preparing a raw material mixture by blending the main component to form the perovskite compound of the non-stoichiometric composition and the sintering aid;
molding the raw material mixture in a predetermined shape; and
performing sintering of the molded raw material mixture.

7. The method for producing the piezoelectric ceramic according to claim 6;
wherein, in the sintering aid, a molar ratio of K to a total number of moles of K, Co, and Ta is not more than four-thirteenths.

8. The method for producing the piezoelectric ceramic according to claim 6;
wherein, in the sintering aid, a molar ratio of Co to a total number of moles of K, Co, and Ta is not more than one-half.

9. The method for producing the piezoelectric ceramic according to claim 6;
wherein, in the sintering aid, a molar ratio of Co to a total number of moles of K, Co, and Ta is not more than three-tenths.

10. The method for producing the piezoelectric ceramic according to claim 6;
wherein, in the sintering aid, a molar ratio of Ta to a total number of moles of K, Co, and Ta is not less than three-tenths.

* * * * *

UNITED STATES PATENT AND TRADEMARK OFFICE
CERTIFICATE OF CORRECTION

PATENT NO. : 9,647,197 B2  
APPLICATION NO. : 13/926347  
DATED : May 9, 2017  
INVENTOR(S) : Koichi Kikuta et al.

Page 1 of 1

It is certified that error appears in the above-identified patent and that said Letters Patent is hereby corrected as shown below:

Assignee (73)
Please add the second Assignee's name to read:
--Brother Kogyo Kabushiki Kaisha--

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*